(12) United States Patent
Chao et al.

(10) Patent No.: US 7,365,342 B2
(45) Date of Patent: Apr. 29, 2008

(54) DEVICE FOR OPERATING GAS IN VACUUM OR LOW-PRESSURE ENVIRONMENT AND FOR OBSERVATION OF THE OPERATION

(75) Inventors: Chih-Yu Chao, Taipei (TW); Wen-Jiunn Hsieh, Taipei County (TW)

(73) Assignee: Bing-Huan Lee, Kaohsiung County (TW)

( * ) Notice: Subject to any disclaimer, the term of this patent is extended or adjusted under 35 U.S.C. 154(b) by 244 days.

(21) Appl. No.: 11/216,049

(22) Filed: Sep. 1, 2005

(65) Prior Publication Data
US 2006/0249687 A1 Nov. 9, 2006

(30) Foreign Application Priority Data
May 9, 2005 (TW) .................................. 94114965
May 31, 2005 (TW) .................................. 94117879

(51) Int. Cl.
*H01J 37/18* (2006.01)
*H01J 37/20* (2006.01)

(52) U.S. Cl. .................... 250/441.11; 250/311; 118/715

(58) Field of Classification Search ...................... None
See application file for complete search history.

(56) References Cited

U.S. PATENT DOCUMENTS

| | | | | |
|---|---|---|---|---|
| 5,582,866 A | * | 12/1996 | White | 427/248.1 |
| 6,403,491 B1 | * | 6/2002 | Liu et al. | 438/710 |
| 2002/0015855 A1 | * | 2/2002 | Sajoto et al. | 428/639 |
| 2006/0249677 A1 | * | 11/2006 | Chao et al. | 250/311 |

* cited by examiner

*Primary Examiner*—Nikita Wells
(74) *Attorney, Agent, or Firm*—Bacon & Thomas, PLLC

(57) ABSTRACT

A device for operating gas in the vacuum or low-pressure environment and for observation of the operation includes a housing. The housing has a thinner part formed at a side thereof, and at least one spacer mounted therein for partitioning off its inside into a gas chamber and at least one buffer chamber outside the gas chamber. The gas chamber has two inner apertures provided on the spacers above and below the gas chamber. The housing has two outer apertures provided respectively on a top side thereof and a bottom side thereof. All of the inner and outer apertures are coaxial with one another and located on the thinner part. The housing has a pumping port for communication with the buffer chamber, and a gas inlet for communication with the gas chamber.

17 Claims, 13 Drawing Sheets

DEVICE FOR OPERATING GAS IN VACUUM OR LOW-PRESSURE ENVIRONMENT AND FOR OBSERVATION OF THE OPERATION

BACKGROUND OF THE INVENTION

1. Field of the Invention

The present invention relates generally to the technology of operating gasiform substance in the vacuum or low-pressure environment, and more particularly, to a device for operating gas in the vacuum or low-pressure environment and for observation of the operation.

2. Description of the Related Art

As far as the technology of microscopic observation is concerned, it is known that a user can employ an electron microscope with its high-power magnification to do scientific research of nanometer substances.

A conventional electron microscope works by utilizing an electron beam to probe the substance. It is necessary to utilize the accelerated electron beam by high voltage and to focus the electron beam by using the electromagnetic lenses to do the microscopic observation in a vacuum environment. As shown in FIG. 11, an electron microscope 61 includes a vacuum specimen chamber 62 for receiving a specimen, and an upper pole piece 66 and a lower pole piece 66 both located in the specimen chamber 62 for ensuring precise focus of the electron beam. The distance between the two pole pieces 66 is usually not larger than 1 cm. However, any specimen received in the specimen chamber 62 must be a solid, not a fluid such as liquid or gas, to allow observation in such vacuum environment, since a fluid specimen is subject to immediate boiling, volatilization, or the like.

To overcome the above problem and to allow the specimen received in the electron microscope to coexist with a specific gas, an environment chamber for controlling vapor was invented in 1976 (Hui S. W. et al., Journal of Physics E 9, 69, 1976). The modified electron microscope 71, as shown in FIGS. 12 and 13, includes a heightened specimen chamber 72, a water tank 74 mounted inside the specimen chamber 72, and an environment chamber 76. The environment chamber 76 has two spacers 762 partitioning its center off into a vapor layer 764 and two buffer layers 766 located respectively below and above the vapor layer 764. The water tank 74 has a temperature-controllable vent pipe 741 connected with the vapor layer 764 for offering vapor of the same temperature as that of the environment chamber 76 to avoid condensation resulting from the entry of the vapor into the vapor layer 764. The two spacers 762 and top and bottom sidewalls of the environment chamber 76 are parallel to one another, each having an aperture 763. The apertures 763 are coaxial with one another for penetration of the electron beam. The environment chamber 76 further has a specimen tube 767 extending outwards from the vapor layer 764, a specimen holder 768 extending through the specimen tube 767 into the vapor layer 764 from outside, and an O-ring 769 sealing space between the specimen holder 768 and the vapor layer 764 for insulation between the vapor layer 764 and the outside.

During operation of the electron microscope 71, the vapor inside the water tank 74 keeps flowing into the vapor layer 764. In the meantime, the two buffer layers 766 are evacuated to pump out the vapor leaking from the vapor layer 764, preventing the vapor from flowing out of the two buffer layers 766 through the two apertures 763 of the environment chamber 76. Thus, the gas pressure inside the vapor layer 764 of the environment chamber 76 can be maintained at 50 torrs or so.

Although the aforementioned prior art can enable generation of extremely low-pressure vapor in the vapor layer, there are still some drawbacks for improvement.

1. It is necessary to alter the original design of the electron microscope. However, disassembling and assembling the electron microscope is very complicated, requiring experts to do it well, and is very costly and subject to damage to electron microscope. Thus, such invention still cannot be applied to mass production.

2. Heightening the specimen chamber of the electron microscope may result in alteration of the focal length of the electron beam to further cause aberration and loss of resolution.

3. Increasing the gas pressure inside the vapor layer will result in leakage of the gas into the vacuum zone, as shown in FIG. 13, disabling the operation of standard atmospheric pressure inside the vapor layer. Although dramatically enhancing evacuation for the buffer layers 766 can overcome this problem, the high-speed pumping rate caused by the enhanced evacuation may result in strong turbulence, causing multiple scattering caused by the electrons impinging the gas molecules and further disabling successful imaging of the electron beam or experiment of electron diffraction.

Another research group for modification of the electron microscope presented an experiment of observation of gasiform and solid chemical reactions under the electron microscope in 2002 (Gai P. L., Microscopy & Microanalysis 8, 21, 2002). Such design is similar to the aforementioned invention, but has the following drawbacks. Because the space between the pole pieces inside the electron microscope is about 1 cm high in size and treated as a gas chamber, if the gas pressure inside the environment chamber keeps increasing, the multiple scattering of the electrons will become excessive. As far as this design of the environment chamber of 1 cm in height is concerned, while the gas pressure inside the environment chamber reaches the standard atmospheric pressure, the multiple scattering of the electrons can disable successful imaging of the electron beam or experiment of electron diffraction.

In addition, Gai's design concept is identical to Hui's in that it is necessary to disassemble the primary part of the electron microscope before installing the whole system including the gas chamber and the buffer layers, such that it is hardly possible to mass-produce the system.

There were also some similar designs/experiments, such as Lee T. C. (Lee T. C. et al., Rev. Sci. Instrum. 62, 1438, 1991), Robertson I. M. (Robertson I. M. at al., Microscopy Research & Technique 42, 260, 1998), Sharman R. (Sharman R., Microscopy & Microanalysis 7, 494, 2001), etc. However, they all exhibit the same problem of multiple scattering of the electrons while operating the gas chamber at the standard atmospheric pressure.

SUMMARY OF THE INVENTION

The first objective of the present invention is to provide a device for operating gas in the vacuum or low-pressure environment and for observation of the operation. The device provides the environment for observation of gas without alteration of original structure of the electron microscope.

The second objective of the present invention is to provide a device for operating gas in the vacuum or low-pressure environment and for observation of the operation. The device can control parameters of pressure of the gas more easily than the prior art to reach higher pressure.

The third objective of the present invention is to provide a device for operating gas in the vacuum or low-pressure environment and for observation of the operation. The device does not affect the resolution of the electron microscope.

The fourth objective of the present invention is to provide a device for operating gas in the vacuum or low-pressure environment and for observation of the operation. The device can be more easily operated and more conveniently assembled.

The foregoing objectives of the present invention are attained by the present invention, which includes a housing. The housing has a thinner part formed at a side thereof, and at least one spacer mounted therein for partitioning off its inside into a gas chamber and at least one buffer chamber outside the gas chamber. The gas chamber has two inner apertures provided on the spacer above and below the gas chamber. The housing has two outer apertures provided respectively on a top side thereof and a bottom side thereof. All of the inner and outer apertures are coaxial with one another and located on the thinner part. The housing has a pumping port for communication with the buffer chamber, and a gas inlet for communication with the gas chamber. Therefore, the device of the present invention can provide the environment for observation of the gas, being conveniently assembled and easily operated, without alteration of the original structure of the electron microscope.

DETAILED DESCRIPTION OF PREFERRED EMBODIMENTS

Figure 1:
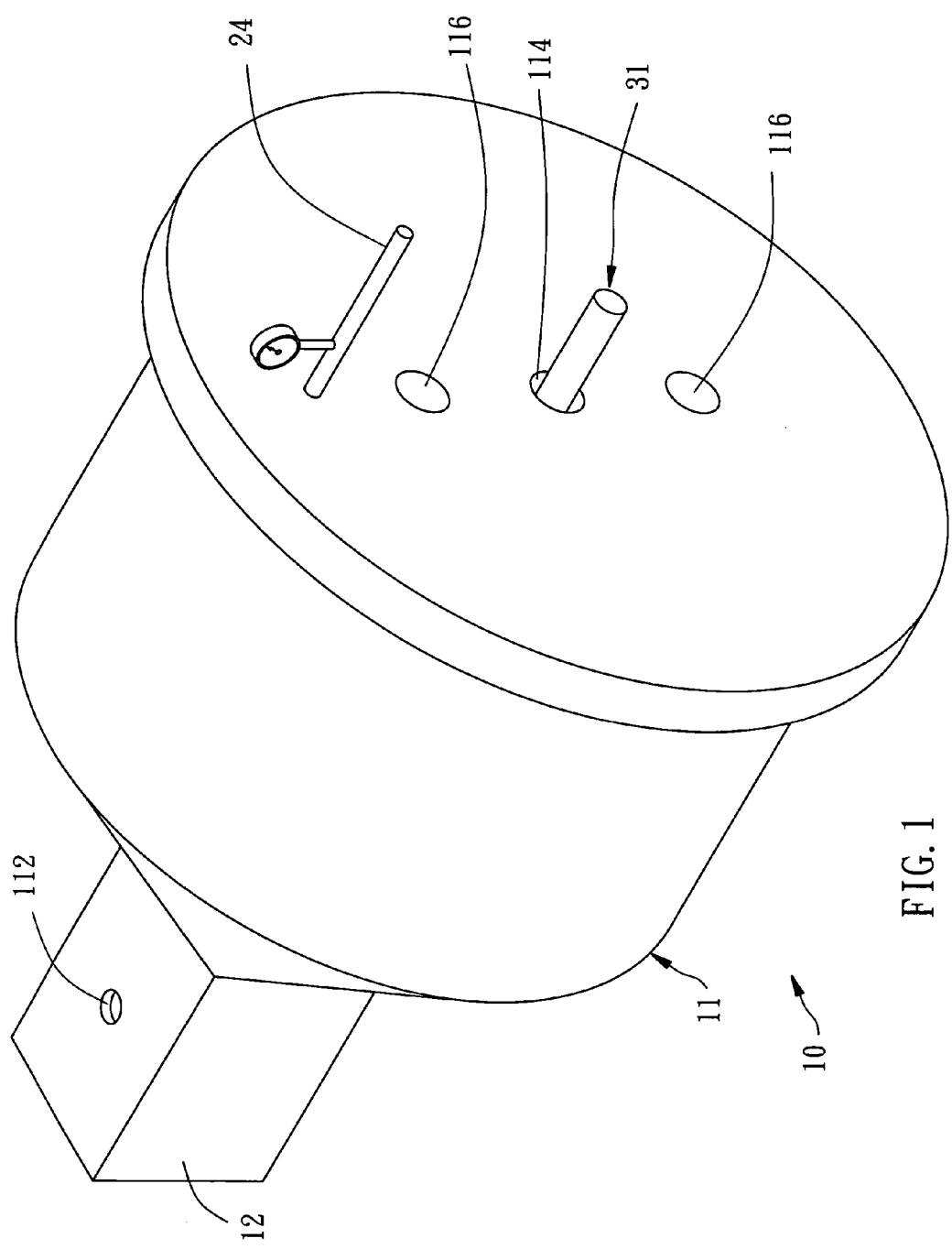
FIG. 1 is a perspective view of a first preferred embodiment of the present invention.
Figure 2:
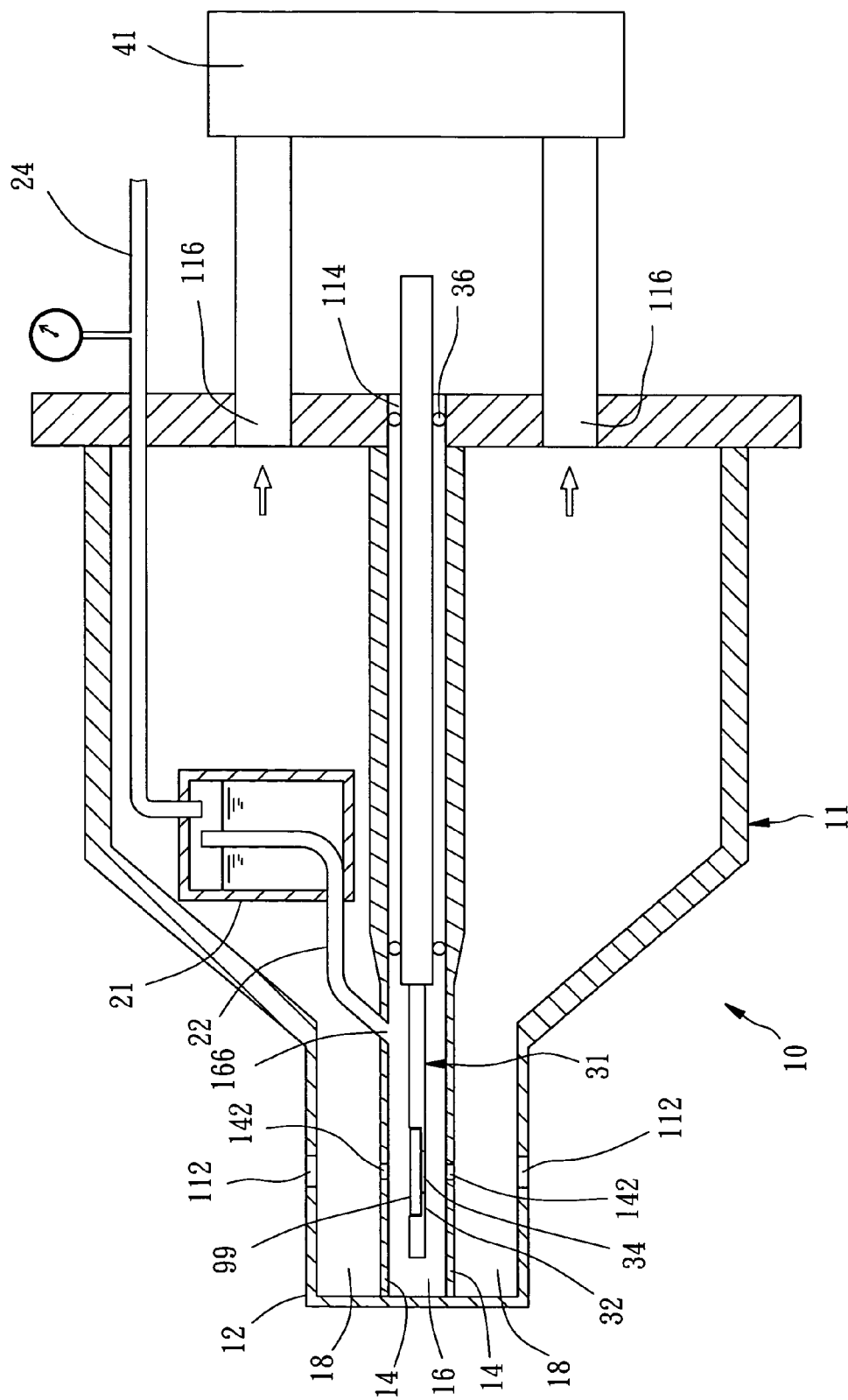
FIG. 2 is a sectional view of the first preferred embodiment of the present invention.
Figure 3:
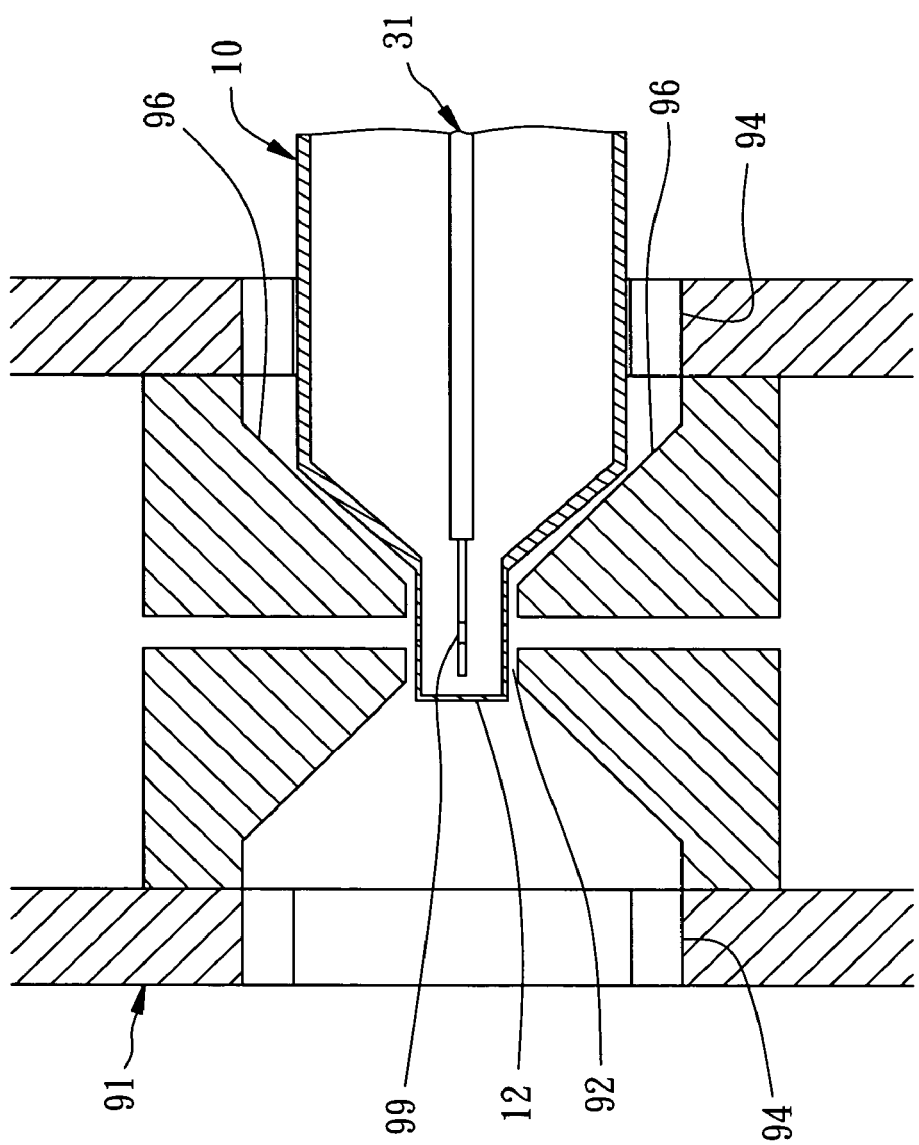
FIG. 3 is a schematic view of the first preferred embodiment of the present invention mounted inside an electron microscope.

Referring to FIGS. 1-3, a device 10 for operating gas in the vacuum or low-pressure environment and for observation of the operation, constructed according to a first preferred embodiment of the present invention, is composed of a housing 11, a temperature-controllable liquid-gas container 21, a specimen holder 31, and a pumping device 41, in cooperation with an electron microscope 91. The electron microscope 91 has a specimen chamber 92 therein, two pole pieces 96 mounted respectively at upper and lower sides of the specimen chamber 92, and an insertion port 94 located at a side of the specimen chamber 92 for inserting the device 10.

The housing 11 includes a thinner part 12 formed at a side thereof, and a plurality of spacers 14 mounted in an interior space within the housing 11. The thinner part has a thickness that is substantially smaller than the distance between the two pole pieces 96 of the specimen chamber 92. The distance between the pole pieces 96 is generally not larger than 1 cm. The spacers 14 partition the interior space of the housing 11 into a gas chamber 16 and two buffer chambers 18 located respectively above and below the gas chamber 16. Inner apertures 142 are formed in the spacers respectively at top and bottom sides of the gas chamber 16. The housing 11 includes two outer apertures 112 formed respectively at top and bottom sides thereof, the outer apertures 112 being coaxially aligned with the inner apertures 142. All of the inner and outer apertures 142 and 112 are located on the thinner part 12 of the housing 11. An insertion slot 114 is defined in the housing 11 corresponding to the gas chamber 16 for communication between the gas chamber 16 and the outside of the housing 11. The housing 11 has two pumping ports 116 formed therein for communication with the buffer chambers 18, and a gas inlet 166 formed therein for communication with the gas chamber 16. Each of the inner apertures 142 has a diameter of 10-200 cm, and each of the outer apertures 112 has a diameter of 20-800 µm. Each inner aperture 142 is smaller in diameter than each outer aperture 112. In the present embodiment, the diameter of the inner apertures 142 is 100 µm, and the diameter of the outer apertures is 200 µm.

The temperature-controllable liquid-gas container 21 is located inside one of the buffer chambers 18, including a temperature-controllable vent pipe 22 and a temperature-controllable conduit 24. The vent pipe 22 is connected with the gas inlet 166 for transferring a gas inside the liquid-gas container 21 to the gas chamber 16, wherein the temperature of the gas is identical to that of the gas chamber 16. The gas can be, subject to requirement, nitrogen, oxygen, helium, carbon dioxide, other gas, a vapor generated from a liquid inside the liquid-gas container 21, or a combination of the aforementioned gases.

The vent pipe 22 extends into the liquid-gas container 21, having a distal end located higher than the level of the liquid inside the liquid-gas container 21, for providing the liquid vapor of this liquid in the liquid-gas container 21. The conduit 24 provides communication between the liquid-gas container 21 and the outside of the housing 11, for offering liquid from outside or directly offering other gas, like helium or nitrogen, etc., which must be heated to the same temperature as the liquid-gas container 21 in advance to prevent the liquid vapor inside the liquid-gas container 21 from condensation caused by the cold gas infused from the conduit 24. In this embodiment, the liquid-gas container 21 contains water of the same temperature as that of the gas chamber 16 for providing the gas chamber 16 with the pressure of saturated water vapor in such temperature.

The specimen holder 31 includes a target stage 32 for loading a specimen. The target stage 32 has an opening 34 and a seal 36. The specimen holder 31 is inserted through the insertion slot 114 to be received in the gas chamber 16. The opening 34 is coaxial with the inner and outer apertures 142 and 112. The seal 36 seals a gap formed between the specimen holder 31 and the gas chamber 16.

The pumping device 41 is connected with the two pumping ports 116 for pumping out, or evacuating, the two buffer chambers 18.

Referring to FIGS. 2 and 3, the device 10 of the present invention can be cooperatively mounted inside the specimen chamber 92 of the electron microscope 91 by inserting the housing through the port 94 of the electron microscope 91. Because the height of the thinner part 12 is smaller than the distance between the two pole pieces 96, the thinner part 12 can be positioned between the two pole pieces 96, enabling the inner and outer apertures 142 and 112 for alignment with the path of the electron beam of the electron microscope 91. The specimen holder 31, loaded with a specimen 99, is inserted from the insertion slot 114 into the gas chamber 16, enabling the specimen 99 for alignment with the inner and outer apertures 142 and 112.

The temperature inside the housing 11, the spacers 14, the liquid-gas container 21, and the specimen holder 31 is controlled to enable the temperature of the gas infused from the vent pipe 22 to be identical to that of the gas chamber 16, the specimen holder 31, and the target stage 32. When the gas chamber 16 is supplied with gas of predetermined pressure by the liquid-gas container 21, and the two buffer chambers 18 are evacuated by the pumping device 41, if any gas leaks out of the gas chamber 16 through the inner apertures 142 into the two buffer chambers 18, the leaking gas will be evacuated from the two buffer chambers 18 without exhausting through the outer apertures 112 outside the housing 11. Controlling the pumping rate of the pumping device 41 and the gas infusion rate of the liquid-gas container 21 can keep the gas inside the gas chamber 16 in a predetermined pressure to enable operating the gas inside the gas chamber 16 in the vacuum environment. The electron beam of the electron microscope 91 passing through the inner and outer apertures 142 and 112 can detect the specimen 99 to enable observation for the user.

Figure 4:
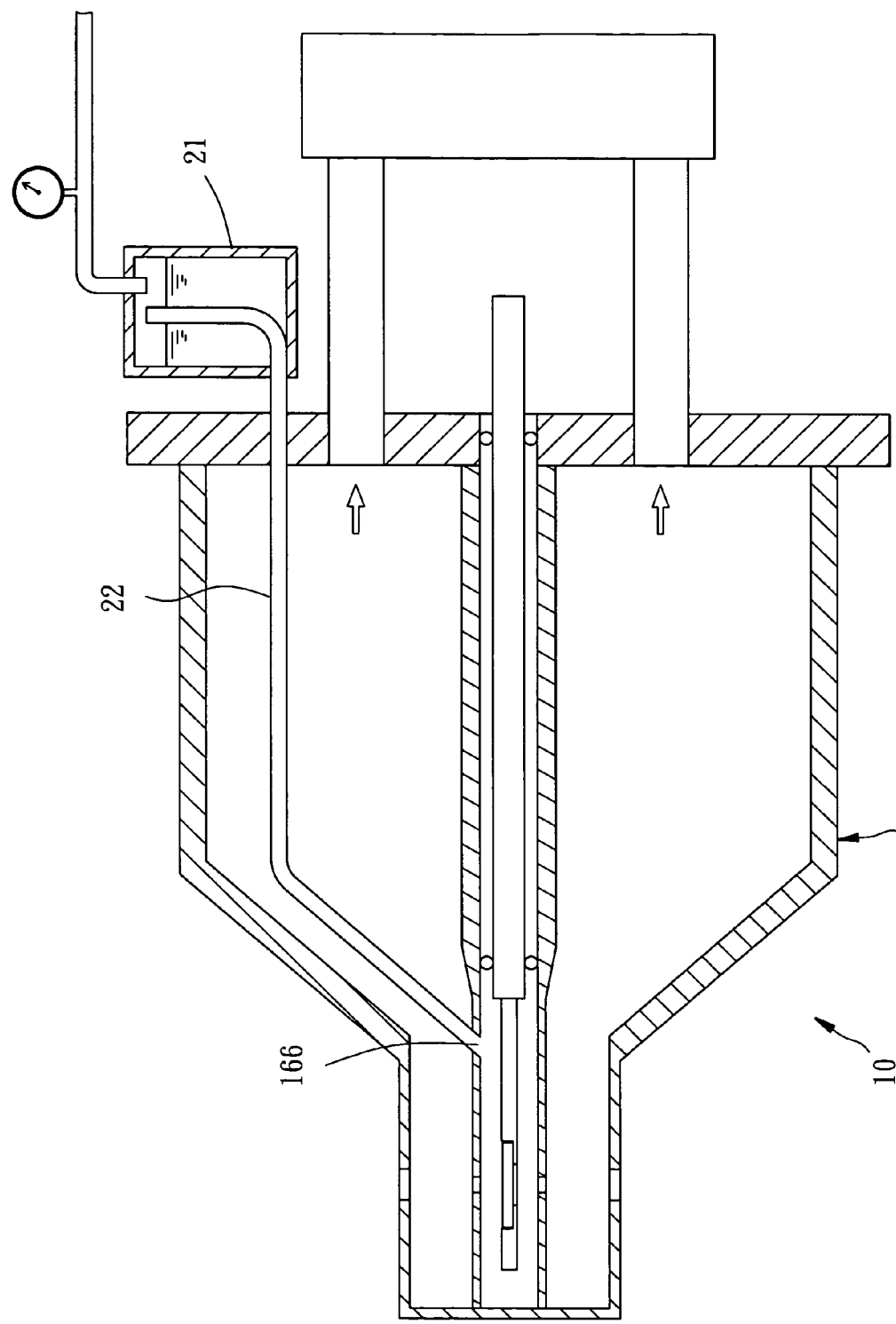
FIG. 4 is a sectional view of the first preferred embodiment of the present invention, in which a liquid-gas container is located outside the housing.

The liquid-gas container 21 can be alternatively mounted outside the housing 11, as shown in FIG. 4, and the vent pipe 22 extended out of the housing 11 for communication between the liquid-gas container 21 and the gas chamber 16. Such structure not only has the same function as that mounted inside the housing 11 but also provides a range of unsaturated vapor pressure. Because the temperature of the liquid-gas container 21 mounted outside of the housing 11 can be controlled to be lower than, instead of the same as, that of the gas chamber 16 and the target stage 32, an environment of vapor pressure lower than the saturated one may be generated around the specimen loaded on the target stage 32. In addition, such structure enables the user to conveniently operate the liquid-gas container 21. For example, the user can switch off the infusion of the gas at any time and accurately observe the level of the liquid and the supply amount of the liquid.

Figure 5:
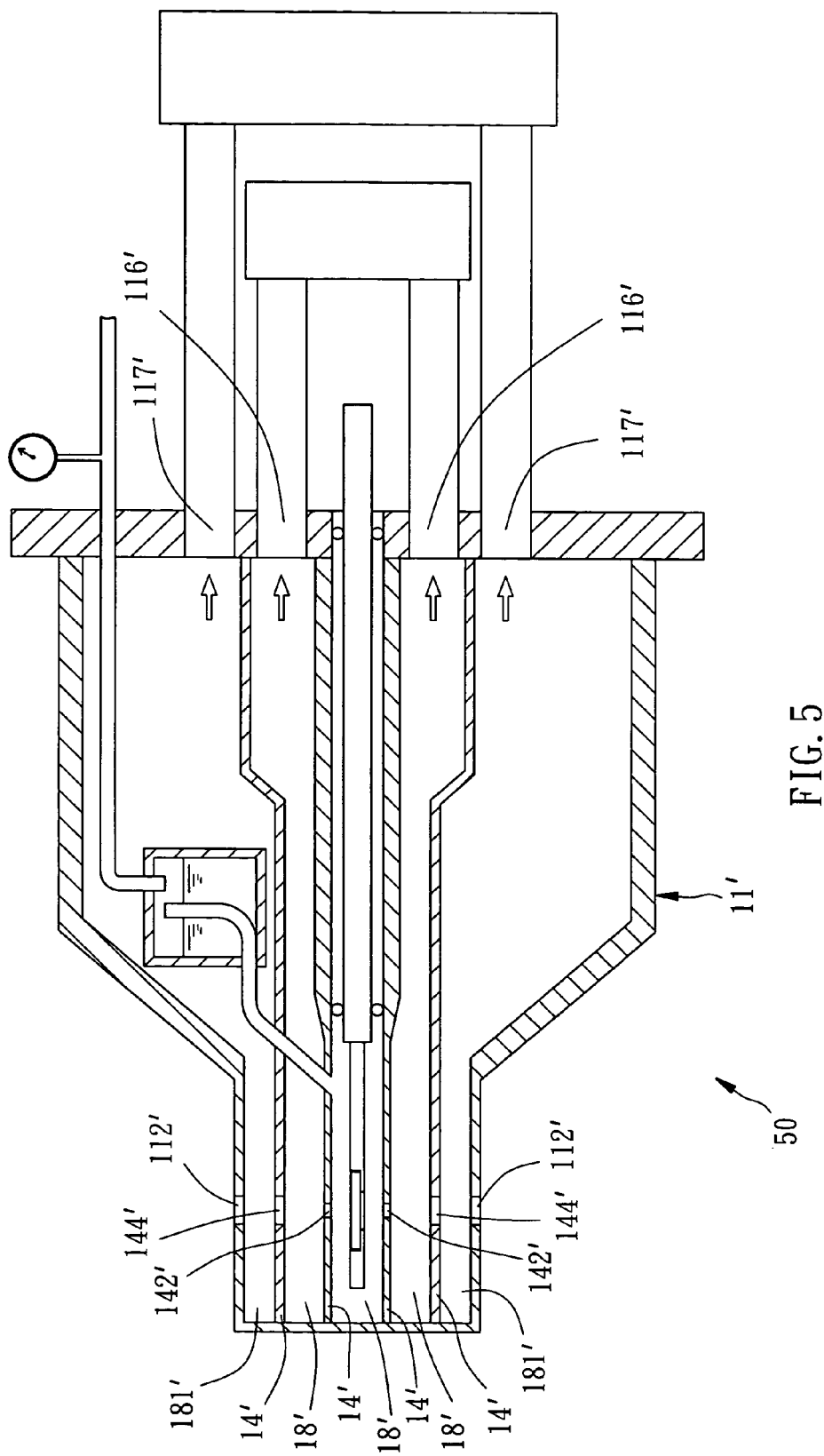
FIG. 5 is a sectional view of a second preferred embodiment of the present invention.

Referring to FIG. 5, a device 50 for operating gas in the vacuum or low-pressure environment and for observation of the operation, constructed according to a second preferred embodiment of the present invention, is similar to the first embodiment, but has differences as follows.

The housing 11' is partitioned off additionally into an upper buffer chamber 181' and a lower buffer chamber 181', which are located respectively above and below the two buffer chambers 18'. Additional pumping ports are formed in the housing 11', there being now the two pumping ports 116' as described in the previous embodiment, and two additional pumping ports 117', wherein the two buffer chambers 18' correspond respectively to the two pumping ports 116', and the upper and lower buffer chambers 181' correspond respectively to the two pumping ports 117'. Two buffer apertures 144' are formed respectively in the two spacers 14' located respectively between the upper buffer chamber 181' and the buffer chamber 18' and the lower buffer chamber 181' and the buffer chamber 18', the buffer apertures 144' being coaxial with the inner and outer apertures 142' and 112'. Each of the two buffer apertures 144' has a diameter of 10-400 μm, the diameter being greater than the diameter of the inner aperture 142' and less than the diameter of the outer aperture 112'. The device 50 employs the four buffer chambers 18' and 181', rather than two as described in the previous embodiment, to achieve the effect of multilayered depressurization through the differential pumping and also a broader operation range of the pumping rates of the four buffer chambers 18' and 181', and to enable the gas chamber 16' to have a much larger pressure than that achieved by the only two buffer chambers 18 in the previous embodiment. Under such circumstance, the pumping rate of the upper and lower buffer chambers 181' must be greater than that of the two buffer chambers 18'.

The second embodiment is similar in operation to the first embodiment. Because the buffer chambers in the second embodiment are twice in number as those of the first embodiment, the controllable range of the differentially pumping rate of the buffer chambers is greater and more flexible. In this embodiment, the user can control the pumping rates of the buffer chambers 18' and 181' respectively at 160 L/sec and 240 L/sec or above, to increase the gas pressure inside the gas chamber 16 up to 760 torrs, in the environment of gas or a gas and vapor mixture, but still preventing the gas from leaking through the outer apertures 112' into the vacuum section outside the housing 11'.

Figure 6:
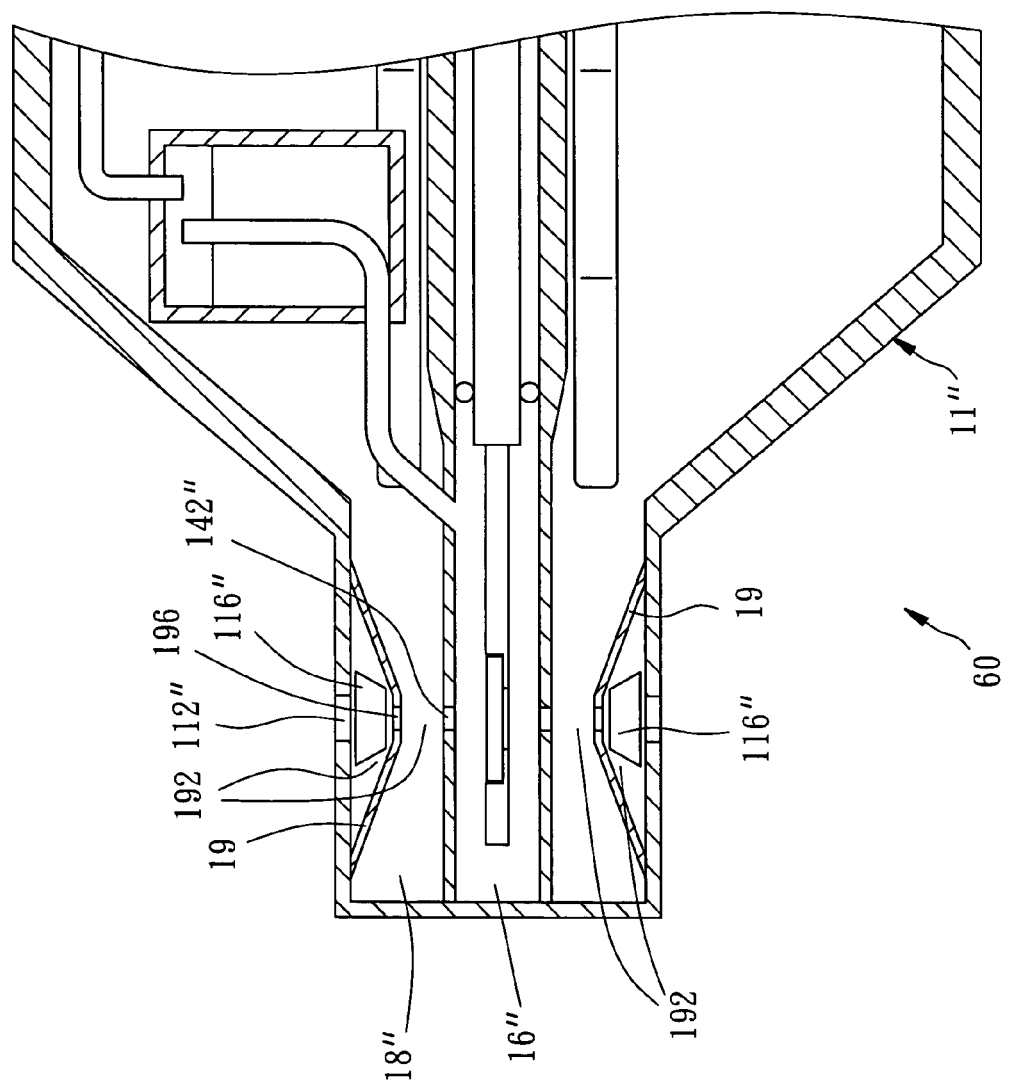
FIG. 6 is a partially sectional view of a third preferred embodiment of the present invention.
Figure 7:
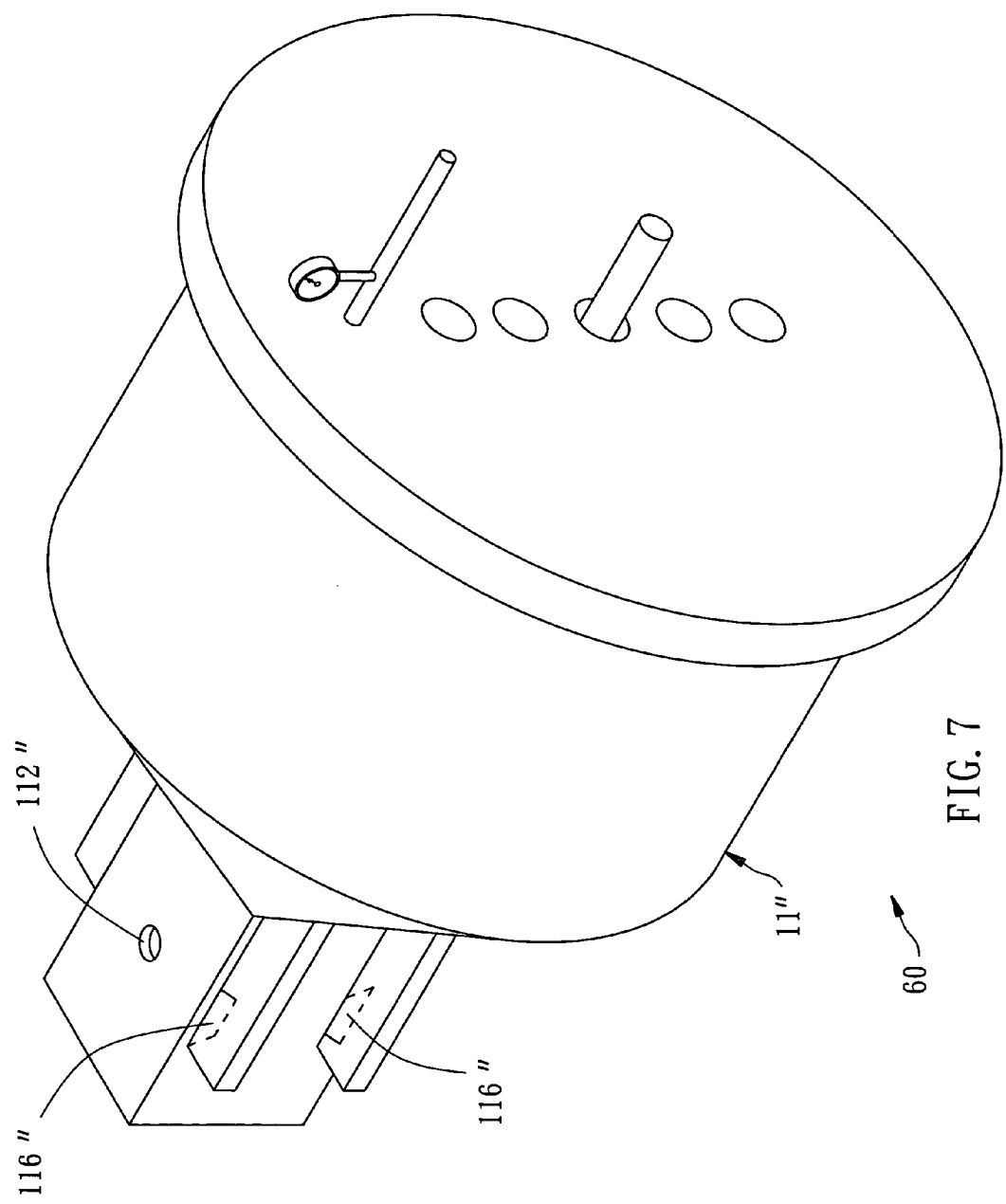
FIG. 7 is a perspective view of the third preferred embodiment of the present invention.
Figure 8:
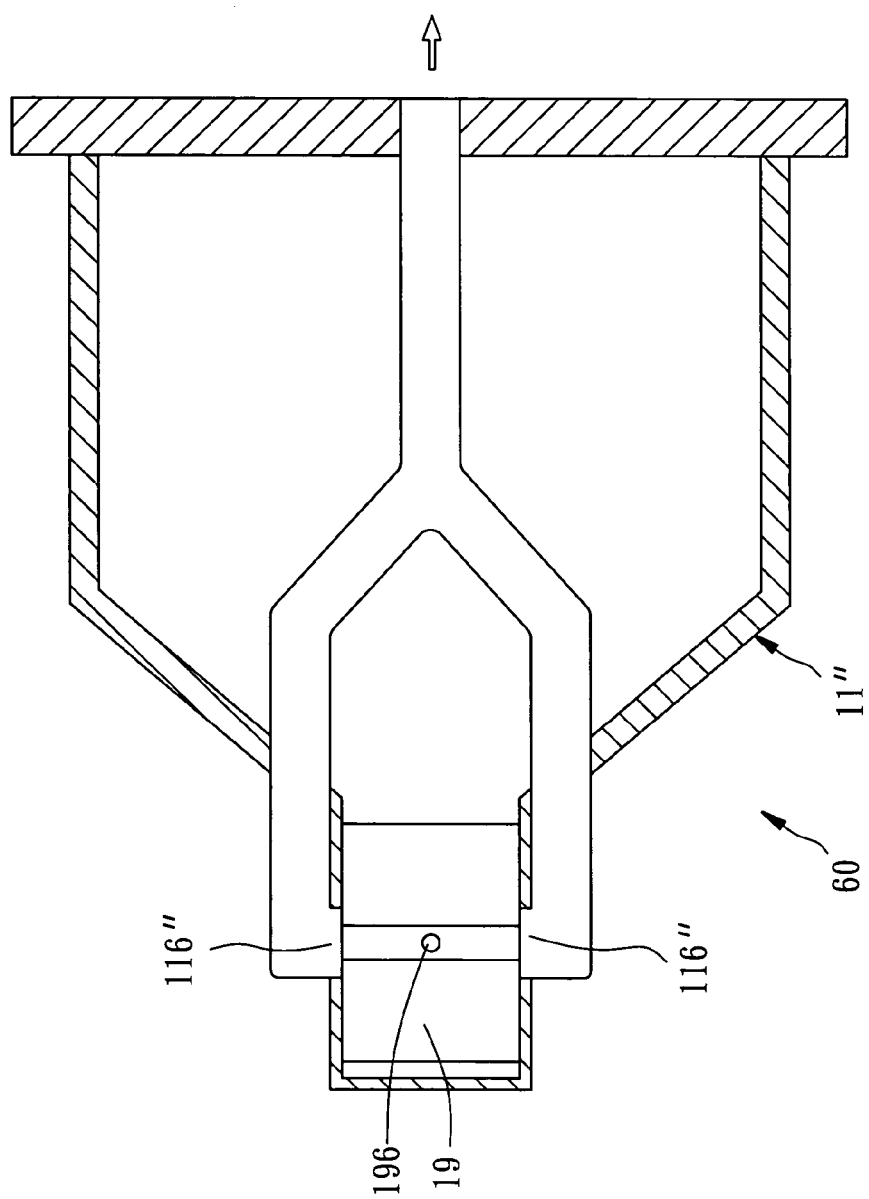
FIG. 8 is a top sectional view of the third preferred embodiment of the present invention.

Referring to FIGS. 6-8, a device 60 for operating gas in the vacuum or low-pressure environment and for observation of the operation, constructed according to a third preferred embodiment of the present invention, is similar to the aforementioned first embodiment, but has differences as follows.

There is an inclined spacer 19 mounted in each of the buffer chambers 18" for partitioning off each buffer chamber 18" into two auxiliary buffer chambers 192. Each of the inclined spacers 19 has a buffer aperture 196 coaxially aligned with the inner and outer apertures 142" and 112". Each of the auxiliary buffer chambers 192 corresponds to one of the pumping ports 116" located in the housing 11" for evacuation of the auxiliary buffer chambers 192.

In this embodiment, the inclined spacers 19 enable the housing 11" to have more buffer chambers 18" without heightening the housing 11". In other words, the device 60 of this third embodiment has two more buffer chambers than the device 10 of the first embodiment. As with the additional buffer chambers 181' in the second embodiment, the structure of the auxiliary buffer chambers based on the principle of multilayered differential pumping not only increase the gas pressure inside the gas chamber 16", up to 760 torrs as indicated in the second embodiment, but also enlarge the controllable range of the pumping rates of the buffer chambers thereby making it more flexible.

Figure 9:
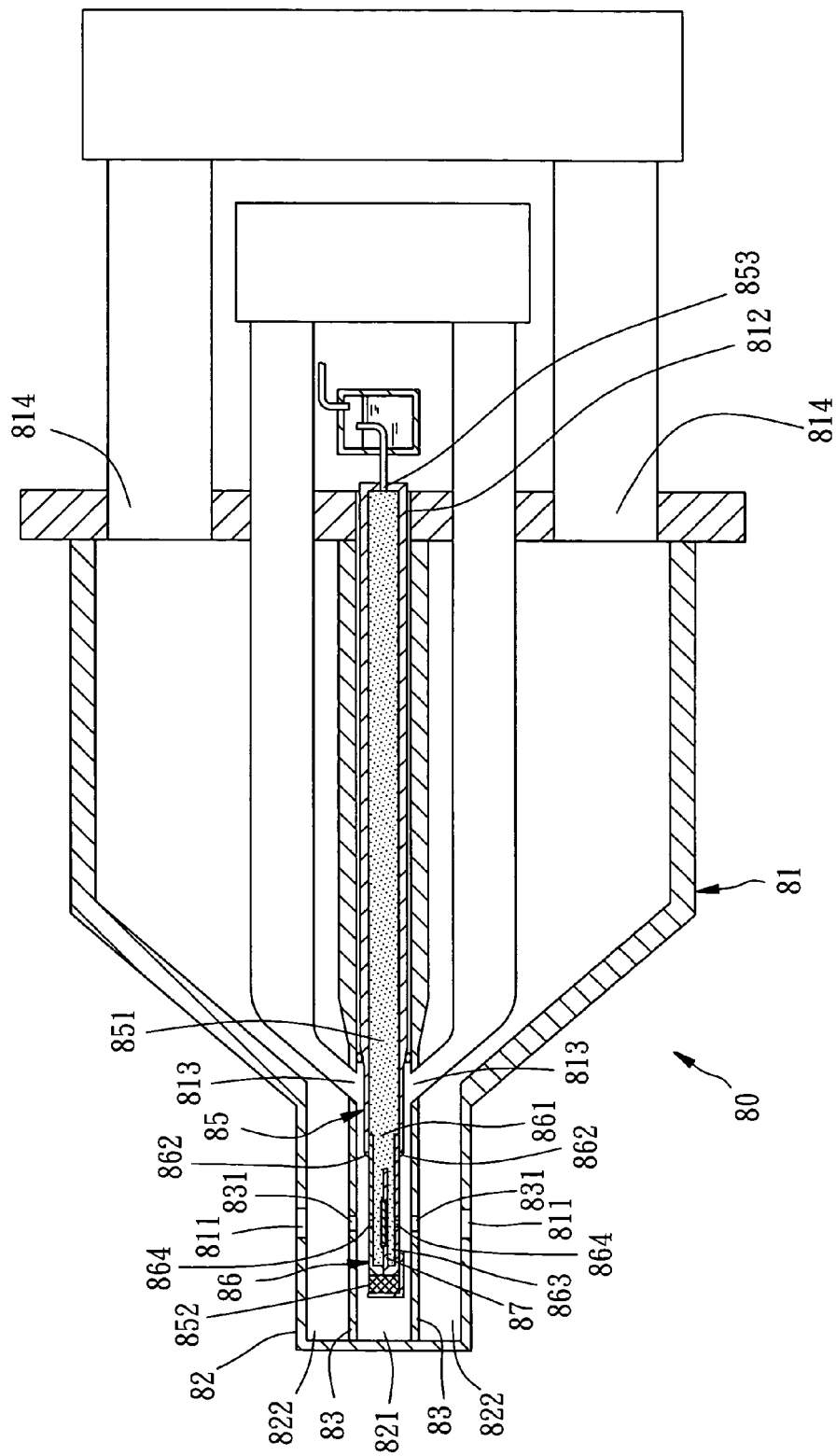
FIG. 9 is a sectional view of a fourth preferred embodiment of the present invention.
Figure 10:
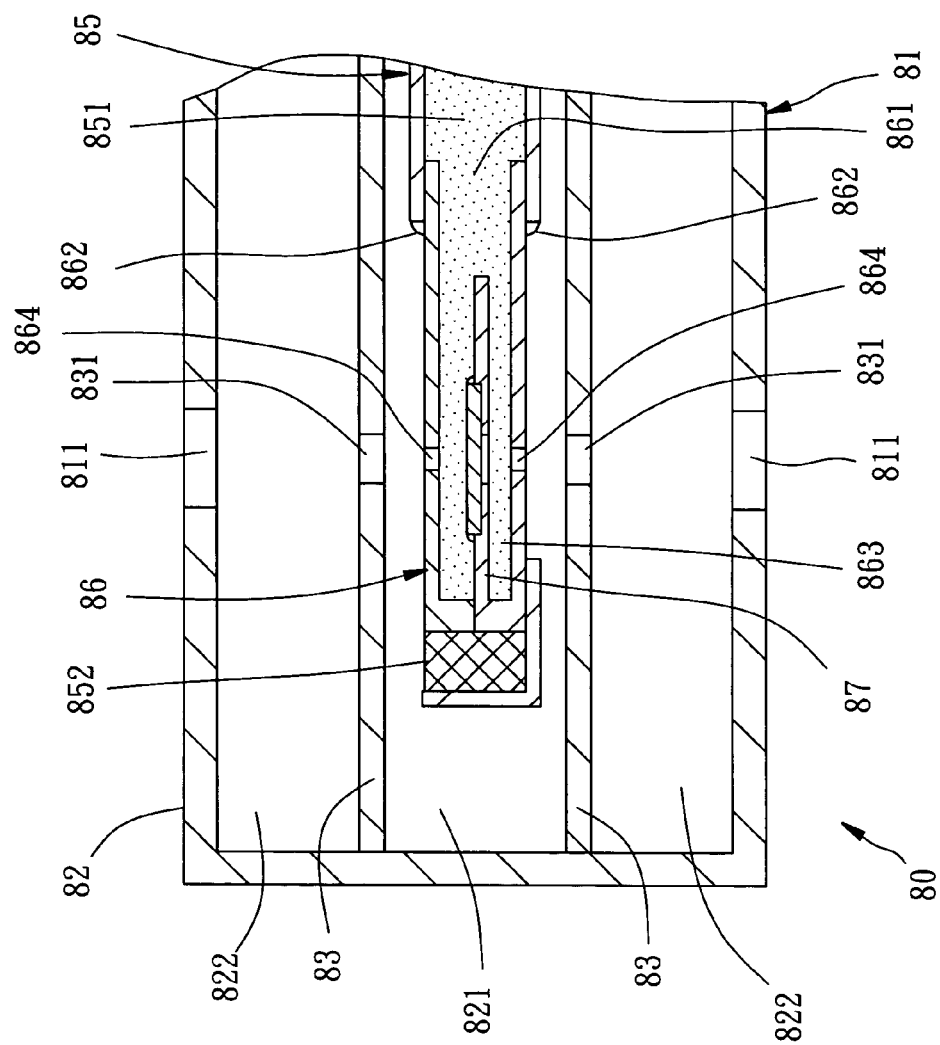
FIG. 10 is an enlarged view of FIG. 9.
Figure 11:
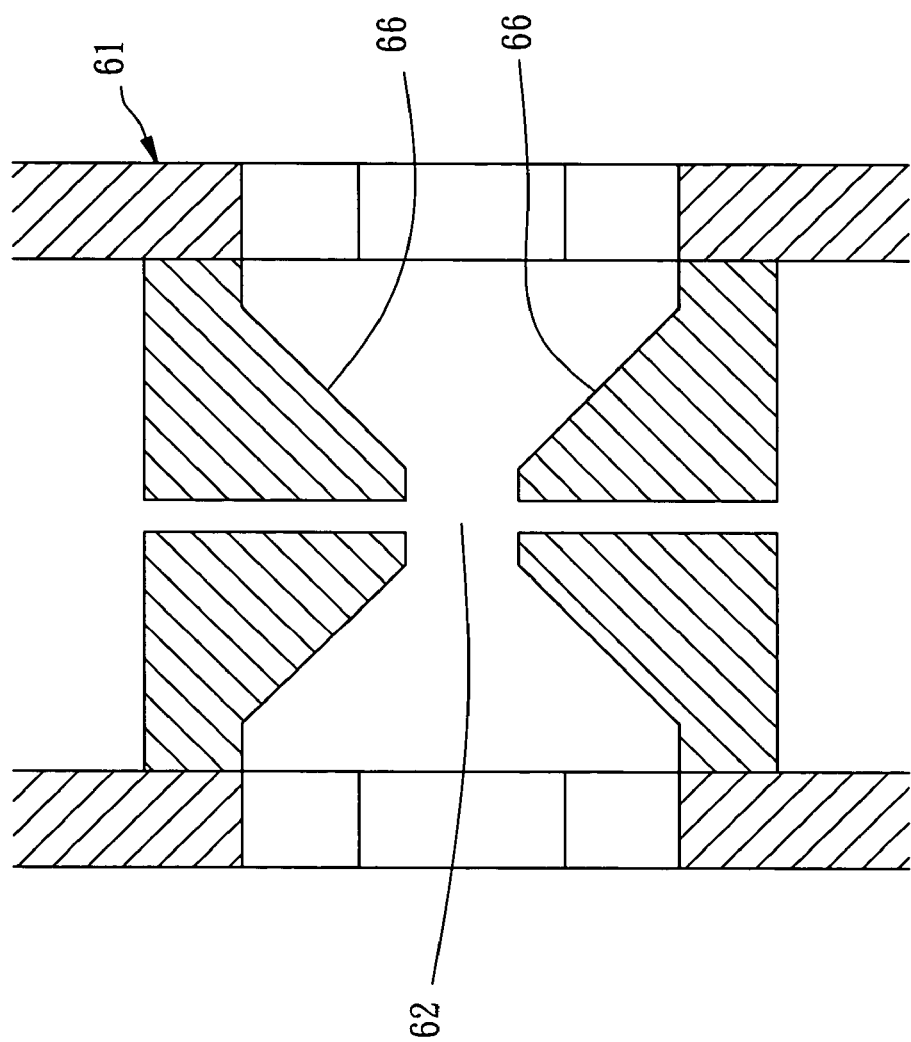
FIG. 11 is a sectional view of an internal part of a conventional electron microscope.
Figure 12:
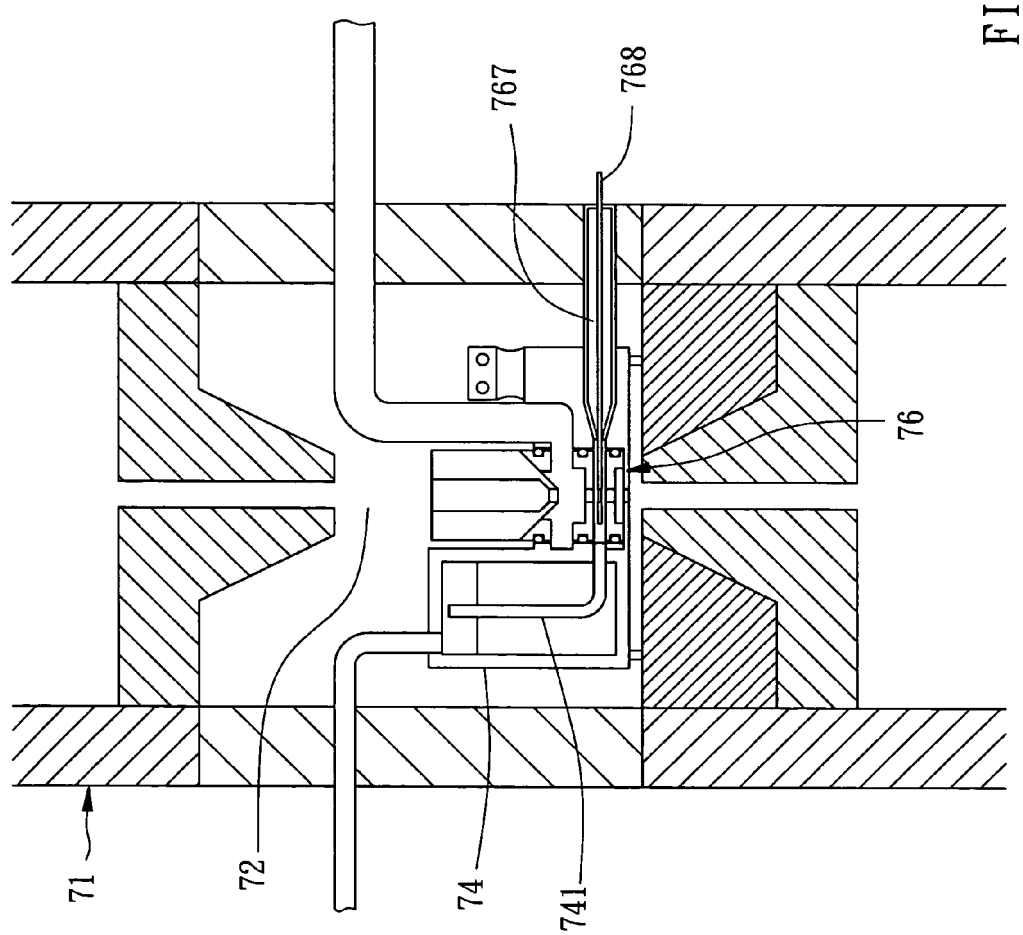
FIG. 12 is a sectional view of the prior art.
Figure 13:
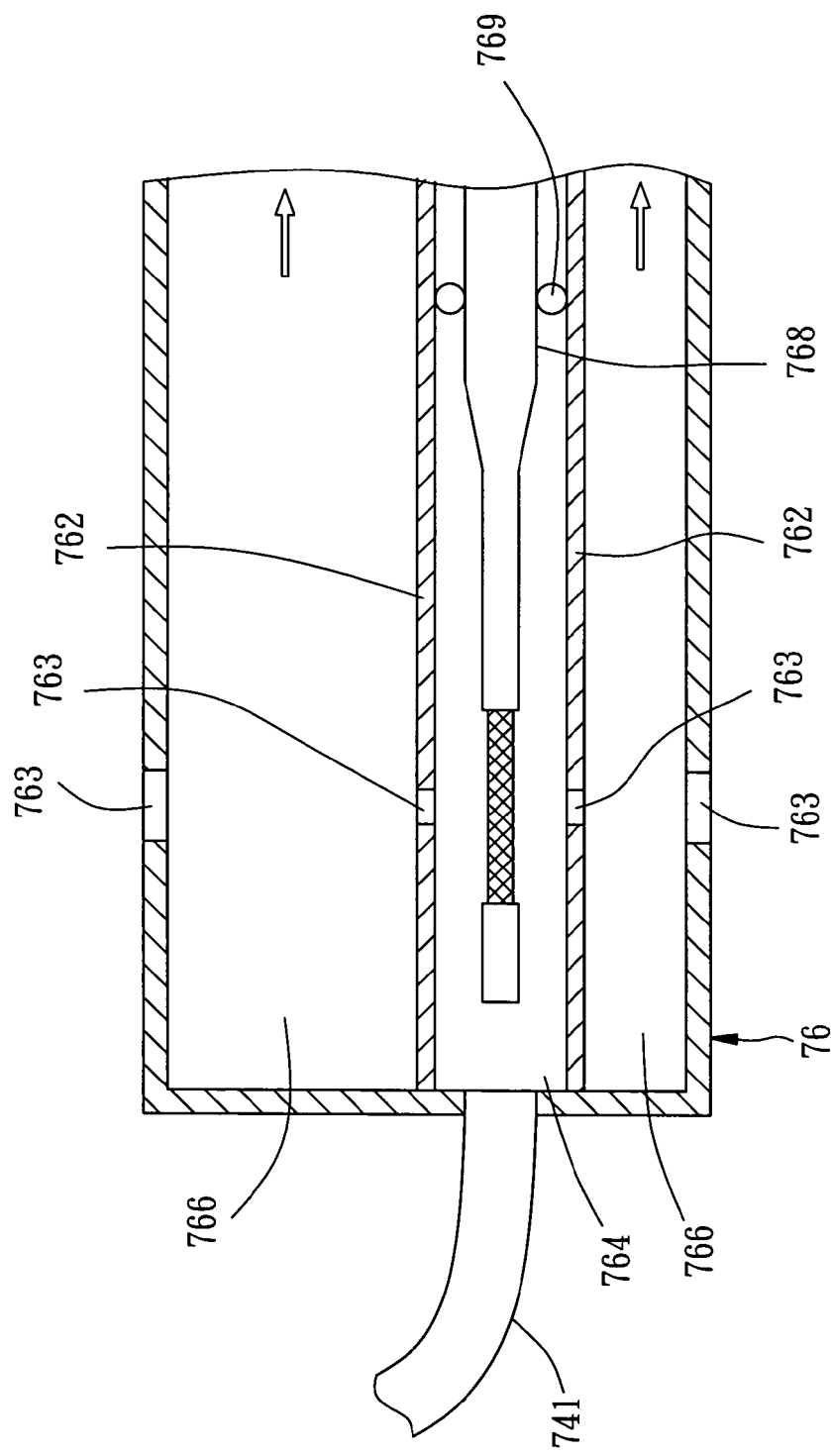
FIG. 13 is a sectional view of a part of the environment chamber of the prior art.

Referring to FIGS. 9 and 10, a device 80 for operating gas in the vacuum or low-pressure environment and for observation of the operation, constructed according to a fourth preferred embodiment of the present invention includes a housing 81 and a specimen holder 85.

The housing 81 has a thinner part 82 formed at one side and two spacers 83 partitioning off its inside into a buffer chamber 821 and two additional buffer chambers 822 formed respectively above and below the buffer chamber

821. Each of the two spacers 83 has a buffer aperture 831 between the buffer chamber 821 and the additional buffer chamber 822, located at a top (bottom) side of the buffer chamber 821. The housing 81 has two outer apertures 811 formed respectively at top and bottom sides thereof for communication with the vacuum section outside the housing 81, an insertion slot 812 in communication with the buffer chamber 821, two pumping ports 813 corresponding to the buffer chamber 821, and two additional pumping ports 814 corresponding to the two additional buffer chambers 822.

The specimen holder 85 is mounted into the buffer chamber 821 through the insertion slot 812, having a gas infusion pipe 851 therein. A gas box 86 has an opening 861 at one end (open end), and the open end is partially inserted in a front end of the specimen holder 85, in communication with the gas infusion pipe 851, and fixed by an adhesive 862. A retaining wall 852 is formed around the gas box 86, and a gas inlet 853 is defined in the specimen holder 85 in communication with the gas infusion pipe 851. The opening 861 or the gas box 86 communicates with the gas infusion pipe 851. The gas box 86 has a target stage 87 formed therein for loading a specimen, a gas chamber 863 formed therein and covering the target stage 87, and two inner apertures 864 formed on a top side and a bottom side of the gas box 86 for communication with the buffer chamber 821. The inner, outer, and buffer apertures are coaxially aligned.

The operation of the fourth embodiment is similar to that of the second embodiment such that no further recitation is necessary. It is to be noted that the temperature of the infused gas through the gas infusion pipe 851 must be lower than or equal to that of a sidewall of the gas infusion pipe 851 to prevent the infused vapor from condensation inside the gas infusion pipe 851.

In the fourth embodiment, the gas chamber 863 is formed inside the specimen holder 85 to transform the gas chamber 863 defined in the first embodiment into a buffer chamber to have one more buffer chamber than the first embodiment. Increasing the number of the differentially pumped buffer chambers without heightening the housing 81 can not only enhance the pressure of the gas chamber up to 760 torrs, but also enables a larger and more flexible range of maneuverability of pumping rate for the buffer chambers.

In conclusion, the present invention includes advantages as follows.

1. Because the present invention is one-piece and can be directly inserted into the predetermined insertion port located on the electron microscope without alteration of the original design of the microscope, it overcomes the problems that installing the conventional environment chamber of the prior art into the electron microscope is quite complex and difficult for mass production. Installing the present invention is quite simple, requiring only simple training before its operation. Additionally, the installation is low-cost and harmless to the electron microscope, thus enabling mass production in the industries.

2. Because it is easy to install the present invention and the user can easily externally control parameters like pumping rate and gas supply rate, it is not necessary to disassemble the electron microscope for adjustment of the parameters and it is easier to control the parameters of the gas pressure.

3. Because it is not necessary to adjust the height of the specimen chamber of the electron microscope for the present invention, it will not cause alteration of the focal length of the electron beam to further eliminate the aberration and loss of resolution as in the prior art.

4. In the prior arts, the distance of the path of the electron beam through the gas is about or greater than the distance between the two pole pieces. The thinner part of the present invention enables the gas chamber to be very thin to greatly reduce the distance that the electron beam passes through the gas, such that no loss of resolution caused by the multiple scattering of the electrons results from the electron beam impinging too many gas molecules. The multilayered and differentially pumped buffer chambers mounted outside the gas chamber of the present invention can allow proper pressure drop in each of different buffer chambers and enlarge the controllable range of the rate of pumping the gas out of the buffer chambers. Thus, the multilayered pressure buffering (depressurization) by differentially pumping those buffer chambers can enhance the gas pressure inside the gas chamber to reach the standard atmospheric pressure.

What is claimed is:

1. A device for operating gas in the vacuum or low-pressure environment and for observation of the operation, comprising:
a housing having a thinner part at one side, said housing having at least one spacer therein for partitioning off an interior space of the housing into a gas chamber and at least one buffer chamber outside said gas chamber, said spacer having two inner apertures located at its top and bottom sides of said gas chamber respectively, said housing having two outer apertures located respectively on its top and bottom sides respectively, said inner and outer apertures being coaxial with one another and located at said thinner part, said housing having a pumping port for communication with said buffer chamber and a gas inlet for communication with said gas chamber.

2. The device as defined in claim 1 further comprising a liquid-gas container connected with said gas inlet by a vent pipe for supplying said gas chamber with a gas.

3. The device as defined in claim 2, wherein said gas is vapor or a specific gas or a mixture of the vapor and said specific gas.

4. The device as defined in claim 3, wherein said specific gas is nitrogen, oxygen, carbon dioxide, other inert gas, or a mixture of said aforementioned gases.

5. The device as defined in claim 2, wherein said liquid-gas container is located in said buffer chamber.

6. The device as defined in claim 2, wherein said liquid-gas container is located outside said housing.

7. The device as defined in claim 1 further comprising a specimen holder, wherein said specimen holder has a target stage having an opening; said housing having an insertion slot defined therein in communication with said gas chamber, whereby said specimen holder is inserted through said insertion slot from outside and then received in said gas chamber, said inner and outer apertures being coaxially aligned to have an imaginary common central axis passing through said opening of said target stage, said specimen holder having a seal sealing a gap between said specimen holder and said gas chamber.

8. The device as defined in claim 1 further comprising a pumping device connected with said pumping port.

9. The device as defined in claim 1, wherein said inner aperture has a diameter of 10-200 μm, said outer aperture has a diameter of 20-800 μm, and each of said inner apertures is smaller in diameter than each of said outer apertures.

10. The device as defined in claim 1 being in cooperation with an electron microscope, said electron microscope having a specimen chamber inside and two pole pieces located in said specimen chamber, wherein said thinner part is smaller in thickness than the distance between said two pole pieces.

11. The device as defined in claim 10, wherein said housing further comprises an upper buffer chamber and a lower buffer chamber formed respectively above and below said buffer chamber, each of said buffer chamber and said upper and lower buffer chambers corresponding to a pumping port, said pumping ports being located on said housing, two buffer apertures being formed on said at least one spacer and located between said buffer chamber and said upper buffer chamber and between said buffer chamber and said lower buffer chamber respectively, said buffer apertures being coaxial with said inner and outer apertures.

12. The device as defined in claim 11, wherein each of said buffer apertures has a diameter of 10-400 μm defined between those of said inner and outer apertures.

13. The device as defined in claim 11, wherein said upper and lower buffer chambers are larger in pumping rate than said buffer chamber.

14. The device as defined in claim 1, wherein each of said buffer chambers further comprises an inclined spacer partitioning it off into two auxiliary buffer chambers, each of said inclined spacers having a buffer aperture in coaxial position with said inner and outer apertures; each of said auxiliary buffer chambers corresponding to said pumping port of said housing.

15. A device for operating gas in the vacuum or low-pressure environment and for observation of the operation, comprising:
   a housing having a thinner part formed on one side, at least one spacer being formed inside said housing and partitioning the inside of said housing into a buffer chamber and an additional buffer chamber formed outside said buffer chamber, said at least one spacer formed between said buffer chamber and said additional buffer chamber having at least two buffer apertures, said at least two buffer apertures being located at a top side and a bottom side of said buffer chamber respectively, said housing having two outer apertures formed respectively on its top and bottom sides for communication with the outside of said housing, an insertion slot formed therein for communication with said buffer chamber, and two pumping ports corresponding respectively to said buffer and additional buffer chambers; and
   a specimen holder mounted through said insertion slot into said buffer chamber, said specimen holder having a gas infusion pipe formed inside, a gas box having an opening at one end, said end being partially inserted in a front end of said specimen holder for communication with said gas infusion pipe through said opening, a gas inlet in communication with said infusion pipe, and a target stage formed inside said gas box for loading a specimen, said gas box having a gas chamber formed inside and two inner apertures formed respectively on a top side and a bottom side of said gas box, said inner apertures enabling said gas box to communicate with said buffer chamber and being coaxial with said buffer and outer apertures.

16. The device as defined in claim 15, wherein said gas box and the specimen holder are combined together with an adhesive.

17. The device as defined in claim 15, wherein said specimen holder comprises a retaining wall formed around said gas box.

* * * * *